United States Patent [19]

Flottman et al.

[11] Patent Number: 5,928,567
[45] Date of Patent: Jul. 27, 1999

[54] OVERVOLTAGE PROTECTION MATERIAL

[75] Inventors: Thomas Harald Flottman, Newark; Francis Joseph Nuzzi, Hockessin; David Bernard James, Newark, all of Del.

[73] Assignee: The Whitaker Corporation, Wilmington, Del.

[21] Appl. No.: 08/816,015

[22] Filed: Mar. 11, 1997

Related U.S. Application Data

[63] Continuation of application No. 08/550,701, Oct. 31, 1995, abandoned.

[51] Int. Cl.$^6$ .................................. H01B 1/02; H01B 1/22
[52] U.S. Cl. .......................... 252/512; 252/513; 252/514; 428/329; 428/404; 174/127; 174/126.2; 338/20; 338/21; 361/127
[58] Field of Search ...................... 428/323, 404, 428/329; 252/512, 513, 514, 518; 361/127; 174/126.2, 127; 338/20, 21

[56] References Cited

U.S. PATENT DOCUMENTS

| | | | |
|---|---|---|---|
| 3,698,940 | 10/1972 | Mersereau et al. | 117/212 |
| 4,714,650 | 12/1987 | Obayashi et al. | 428/265 |
| 4,726,991 | 2/1988 | Hyatt et al. | 428/329 |
| 4,813,891 | 3/1989 | Walters et al. | 439/620 |
| 4,977,357 | 12/1990 | Shrier | 338/21 |
| 4,992,333 | 2/1991 | Hyatt | 428/402 |
| 5,068,634 | 11/1991 | Shrier | 338/21 |
| 5,099,380 | 3/1992 | Childers et al. | 361/56 |
| 5,142,263 | 8/1992 | Childers et al. | 338/21 |
| 5,183,698 | 2/1993 | Stephenson et al. | 428/209 |
| 5,189,387 | 2/1993 | Childers et al. | 338/20 |
| 5,246,388 | 9/1993 | Collins et al. | 439/620 |
| 5,248,517 | 9/1993 | Shrier et al. | 427/58 |
| 5,260,848 | 11/1993 | Childers | 361/127 |
| 5,262,754 | 11/1993 | Collins | 338/21 |
| 5,278,535 | 1/1994 | Xu et al. | 338/20 |
| 5,340,641 | 8/1994 | Xu | 428/209 |
| 5,393,597 | 2/1995 | Childers et al. | 428/242 |
| 5,476,714 | 12/1995 | Hyatt | 428/402 |
| 5,483,407 | 1/1996 | Anastasio et al. | 361/56 |

*Primary Examiner*—Deborah Jones
*Assistant Examiner*—Cathy F. Lam

[57] ABSTRACT

A solvent-free liquid conductive material designed to protect electrical components, such as printed circuit boards from high pulse static electricity. The solvent-free liquid conductive material comprises a liquid silicone polymer, powdered metallic compound, non-conductive inorganic powder and a curing agent. The conductive material is applicable to both additively and subtractively processed printed circuit boards.

9 Claims, 8 Drawing Sheets

OVERVOLTAGE PROTECTION MATERIAL

This application is a continuation of application Ser. No. 08/550,701 filed Oct. 31, 1995, now abandoned.

FIELD OF THE INVENTION

The field of the present invention relates to protecting a printed circuit board against high pulse static electricity with a solvent-free liquid conductive material.

BACKGROUND OF THE INVENTION

The present invention utilizes a conductive material that provides overvoltage protection upon a printed circuit board. Conductive material providing overvoltage protection is set forth in U.S. application Ser. No. 08/317,988 (recently allowed); U.S. Pat. Nos. 5,248,517; 4,977,357; 5,068,634; 5,099,380; 5,142,263; 5,189,387; 5,260,848; 5,262,754; and 5,248,517 which are incorporated by reference.

These patents relate to the conductive material composition, applications of the conductive material to electrical components, such as POLYCLAMP® connectors by AMP Incorporated (part numbers 93711-1 to 93716-1). In particular, the conductive material referred to mostly in the patents is an aluminum filled silicone rubber. This conductive material has for example the composition of 28.8 wt % silicone rubber, Q4475-8 by Dow Corning; 52.4 wt % aluminum powder, x30 (spherical) by Alcan; 15.7 wt % aluminum trihydrate, hydral 705; and 3.1 wt % organic peroxide curing agent, CST peroxide. This conductive material is a rubbery composition which makes it extremely difficult to uniformly apply the material to non-planar objects that require a uniform application, like printed circuit boards. In some instances, the conductive material is applied into holes of a perforated conductor to allow the rubbery puddy conductive material to be applied easier. Moreover, overlaying the conductive material or perforated conductor is a full metal electrode, such as a foil material that is soldered or plated to ground contacts.

It has been suggested in U.S. Pat. No. 5,248,517 to make the conductive material paintable/coatable. To make the conductive material paintable/coatable, the material is combined with a solvent such as naphtha, xylene, acetone or methyl-ethyl ketone. After the conductive material is applied to the desired electronic component, the solvent of the conductive material evaporates during a curing process at 120° C. The conductive material has even been contemplated to be applied to printed circuit boards.

The function of the inventions disclosed in these patents has also been to filter out electrostatic spikes and to protect electronic components from damage. These patents however have limited the application of these patents to the puddy-like and paintable conductive material composition and applying this conductive material to electronic components, specifically connectors or printed circuit boards.

OBJECTS OF THE INVENTION

It is an object of the present invention to provide a novel solvent-free liquid conductive material composition.

It is another object of the present invention to provide a method to apply the novel solvent-free liquid conductive material composition to electronic components, particularly printed circuit boards.

Another object of the present invention is to provide a printed circuit board overlayed in part by a solvent-free liquid conductive material.

An object of the invention is to have a novel solvent-free liquid conductive material composition overlay an electronic component, wherein the material provides overvoltage protection to the component.

Another object of the invention is to have a novel solvent-free liquid conductive material composition overlay an electronic component which is then overlayed by an adhesive metallic ink layer contacted to a ground conductor.

An object of the present invention is to provide method to apply a novel solvent-free liquid conductive material composition to an electronic component.

SUMMARY OF THE INVENTION

The objects of the invention have been accomplished by providing a solvent-free liquid conductive material comprising a liquid silicone polymer, a powdered metallic compound, a non-conductive inorganic powder and a curing agent that provides protection against high pulse static electricity.

Embodiments of the invention will now be described with reference to the accompanying drawings, according to which:

It should be noted that FIGS. 3–7 illustrate shaded areas on graphs that represent the location of the majority of discrete data points for each graph, excluding only a few stray data points. Each graph had so many points in the shaded area that it was determined that a shaded area would more clearly illustrate the meaning of the graph than discrete data points.

DETAILED DESCRIPTION OF THE INVENTION

Figure 8:
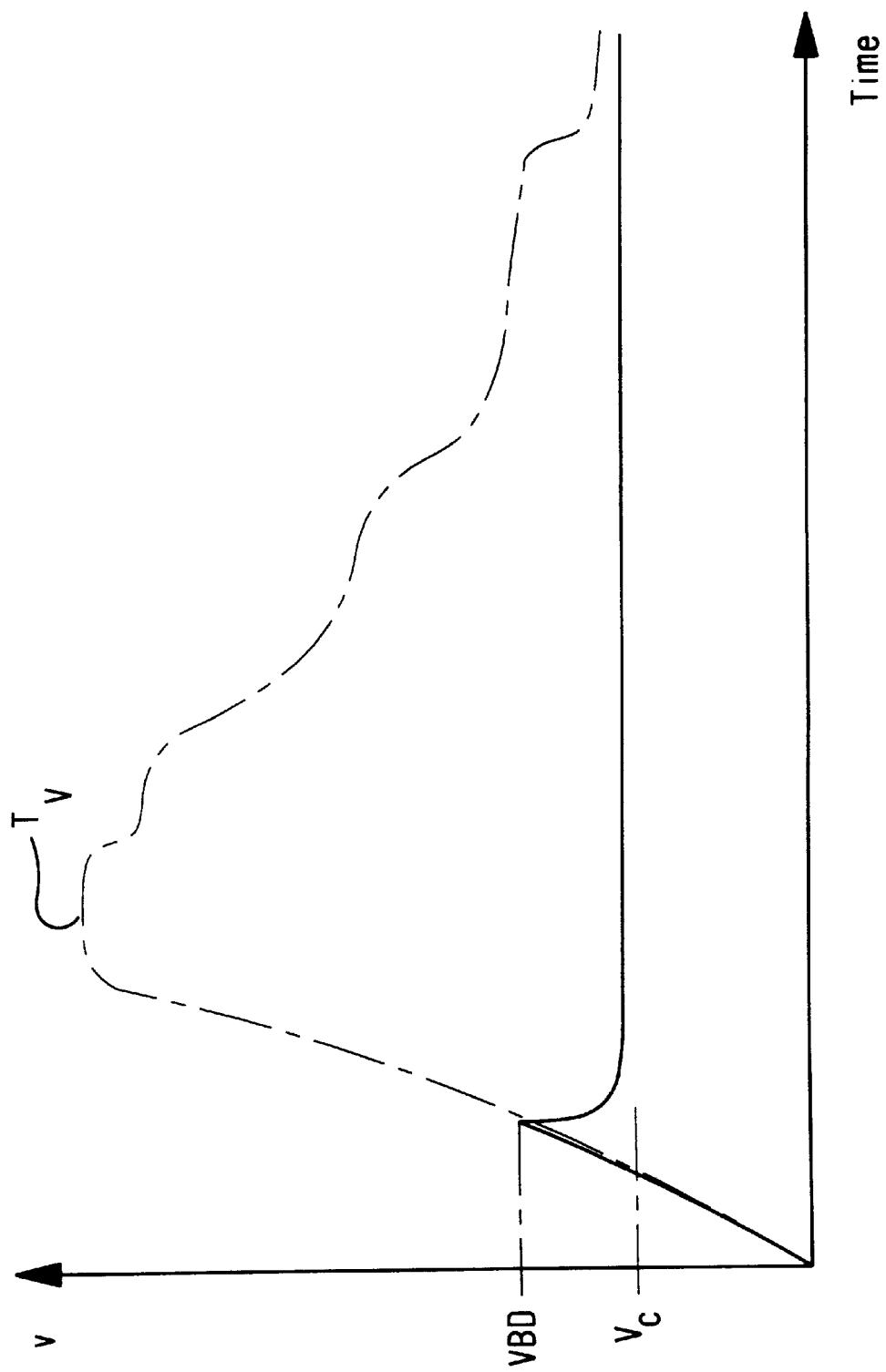
FIG. 8 is a voltage/time plot depicting the characteristics of an invention device relative to an overvoltage pulse.

Referring first to FIG. 8, a voltage/time plot is shown with a transient pulse $T_v$, which may be considered to be of a voltage level and an energy content in excess to that which a given component, such as an integrated circuit, can withstand without damage or destruction. The voltage transient $T_v$ may appear on a signal line caused by a wide variety of reasons ranging from the buildup of static charges on personnel or equipment, voltages induced by lightning or accidental shorting of higher voltage supplies or devices, or voltages induced in collateral circuits due to a sudden voltage surge resulting from the closure of switches or the opening of switches to start up or shut down electrical equipment. Most typically, such voltage transients $T_v$ appear on cables or conductors and connectors utilized for transmitting signals to electronic components, such as integrated circuits that manipulate data and perform various logic functions to in turn control computational transmission equipment.

The voltage $T_v$ may be as much as many thousands of volts or as little as less than a hundred volts; upon electronic components, such as integrated circuits, typically operating in a range of between 3 and 12 volts, with some devices operating slightly higher. The time of response shown in FIG. 10 may represent a period as small as a few nanoseconds, with the rise time of $T_v$ representing several nanoseconds, and/or milliseconds. The area under the curve represents the joule energy of the pulse, another necessary consideration in terms of protection from overvoltage and the resulting overstress of components. With respect to the invention, it is necessary then to examine both the need for overvoltage protection and excessive energy represented by $T_v$ for the given components being protected. Once this is done, a particular specification of protection device, in terms of voltage breakdown, to shunt unwanted transients to ground and a clamping voltage may be chosen. In FIG. 8, $V_{BD}$ represents a breakdown of voltage for a given protection device, and $V_c$ represents the clamping voltage that the device will hold indefinitely in the presence of excessive voltage.

Figure 1:
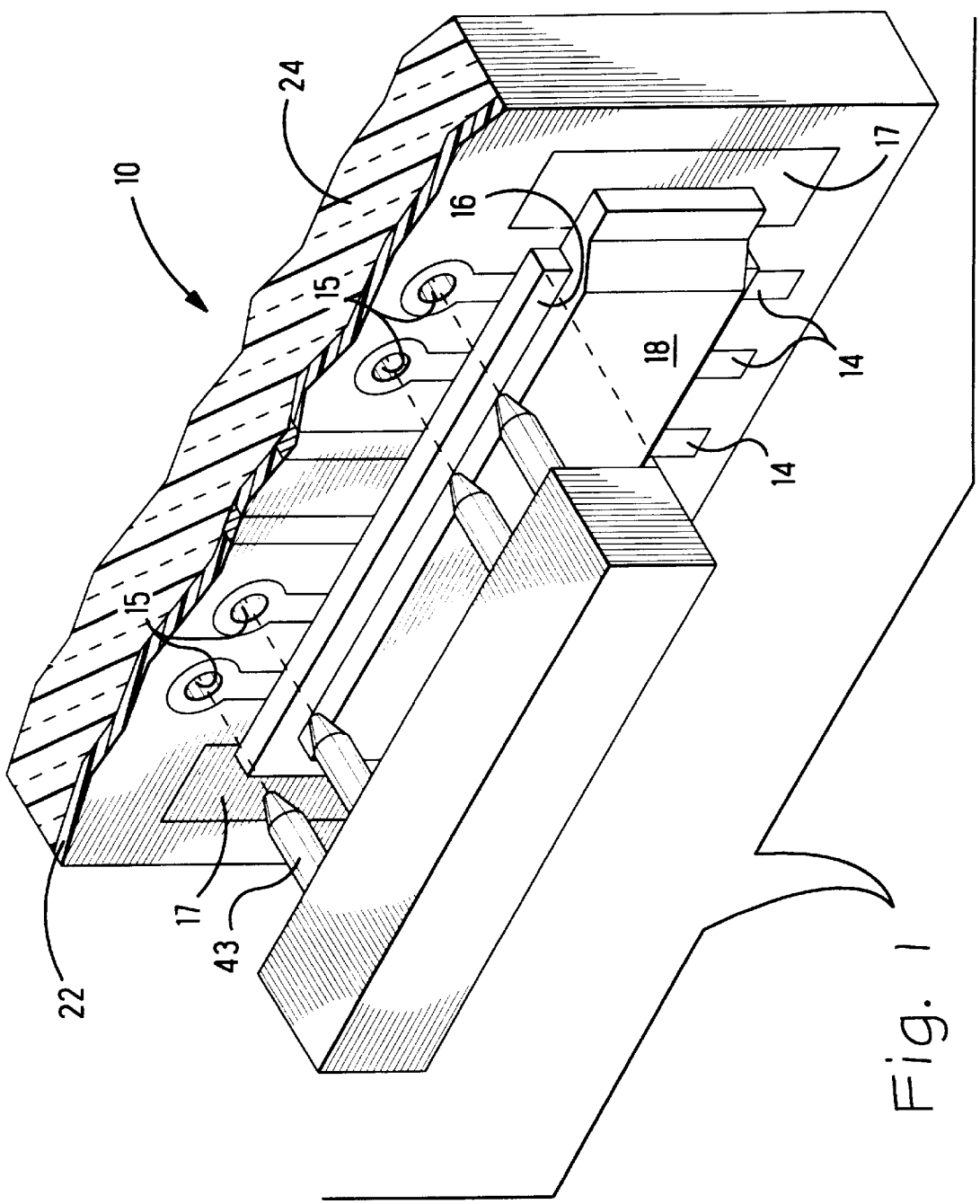
FIG. 1 is an isometric view of the present invention on an additive processed circuit board.

In accordance with FIG. 1, there is a printed circuit board 10 having a base laminate 24 overlayed by a permanent resist material 22, solder coated conductor lines 14 leading to pads and holes 15, for pin contacts 43, and at least one ground contact line 17 that are overlayed by a conductive material 16, which is overlayed by an adhesive metallic ink 18 layer.

Conventional materials and process to manufacture both the resist material 22 and the base laminate 24 are set forth and incorporated by reference in U.S. Pat. No. 3,698,940.

The composition and method to apply the conductor lines 14, pads and holes 15, and ground lines 17 are applied upon the base laminate 24 by an additive, subtractive or combination process thereof as set forth in U.S. Pat. No. 3,698,940.

As for the conductive material 16, the conductive material is a solvent-free liquid composition. The conductive material provides overvoltage protection from stray static electricity. This conductive material has quantum mechanical tunneling properties and foldback switching properties. These quantum mechanical tunneling properties are incorporated and fully disclosed in U.S. Pat. No. 4,977,357. As for the foldback switching properties, these properties are fully disclosed and incorporated in reference in U.S. Pat. No. 5,189,387.

To prepare the solvent-free conductive material 16 of either the quantum mechanical tunneling type or the foldback switching type, the conductive material comprises a solvent-free liquid silicone polymer composition, powdered metallic compound, non-conductive inorganic powder and a curing agent. The term solvent-free means that conventional organic solvents such as naphtha, xylene, methyl-ethyl ketone, or toluene; or water are not used in the conductive material.

The solvent-free liquid silicone polymer must be able to provide overvoltage protection. An example is a silicone polymer such as silicone General Electric RTV11. The liquid polymer ratio is by volume 40–60 parts, preferably 45–55 parts, and most preferably 50 parts.

The powdered metallic compound is any conductive metal powder, such as aluminum, beryllium, iron, gold, silver, platinum, lead, tin, bronze, brass, copper, bismuth, cobalt, magnesium, molybdenum, palladium, tantalum, tungsten, and alloys thereof, especially aluminum powder, particularly Alcan X30. The ratio of the powdered metallic compound in volume is 25 to 45 parts, preferably 30 to 40 parts and most preferably 35 parts.

The non-conductive inorganic powder is utilized to establish and maintain the inter-particle spacing of the conductive metal powder particles to ensure the proper quantum mechanical tunneling behavior during application of an electrical overvoltage situation. An example of such an inorganic powder is aluminum trihydrate, particularly Hydral 705. The ratio of the inorganic powder in volume is 1 to 20 parts, preferably 5 to 15 parts and most preferably 10 parts.

The curing agent is conventional and the ratio of the curing agent in volume is about 0.1 to 0.5 parts. A representative example of the curing agent is dibutyl tin dilaurate which cures through condensation.

The process of fabricating the conductive material occurs in a conventional mixer. Since the polymer is in liquid form, the other agents are slowly added to the polymer in the mixer. After complete mixing of the conductive material, the conductive material is applied to a first predetermined location on the permanent resist, conductor lines and ground lines wherein the first predetermined area is prepared by applying an adhesion promoter. The adhesion promoter is a silane composite, preferably a vinyl silane, and more preferably vinyl trimethoxy silane.

The solvent-free conductive material is applied to the first predetermined location by a silk screening, spreading, stencil printing, or brushing. The conductive material when applied ranges from 1–3 mils thick and preferably 2 mils. Curing the conductive material occurs at a temperature below 93° C. Preferably the curing occurs at either room temperature for twenty-four hours or eighty degrees Celsius for two hours.

After curing the conductive material, the conductive material has a glossy surface layer. To apply overlayers to the conductive layer, the glossy surface layer of the conductive material should be removed. The removal of the glossy surface layer is performed by any means to remove a thin layer of the conductive material, for example soft brushing. The removal of the glossy surface layer also exposes the metal filler particles and hence gives a lower electrical contact resistance to any overlaying layers, such as the adhesive metallic ink layer.

Upon the solvent-free conductive material and in contact with at least one ground line 17 in a second predetermined location that is not in contact with a conductor line, is an adhesive metallic ink layer. This metallic ink layer is an epoxy based polymer impregnated with a high electric conductor like silver or copper. The metallic ink layer is applied to the second predetermined location with a thickness ranging from 1 to 3 mils and preferably about 2 mils. The ink layer is overlayed upon the conductive material by standard equipment, such as silk screening. After the metallic ink layer is applied, the ink layer is cured at 150° C. for 0.5 hours.

EXAMPLES

Example 1 has a solvent-free liquid conductive material being prepared by mixing 53 parts by volume of GE RTV11 liquid silicone polymer and 0.1 parts by volume of dibutyl tin dilaurate with 37 parts by volume of Alcan x30 aluminum powder and with 10 parts by volume of Hydral 705 aluminum trihydrate powder. The materials were mixed together in a plastic container using a standard laboratory mixer with a multi-blade mixing head. An additive type printing wiring board (PWB) was prepared, slightly roughened on the surface and cleaned. Predetermined locations for the liquid conductive material on the additive type PWB, exposing portions of solder coated conductor traces, were treated with a vinyl silane solution. After the silane treatment the PWB was dried in a convection oven at 105° C. for 20 minutes. The solvent-free conductive material was then stencil printed onto the first predetermined areas on the PWB yielding a 2 mils thick layer. This silicone layer was cured in a convection oven at 80° C. for 2 hours. The cured silicone layer was roughened on the surface by a soft brushing operation and then cleaned by a water rinse, followed by drying with pressurized air. A copper based polymer thick film conductive paste was applied by screen printing on a second predetermined areas of the PWB over the previously applied conductive silicone, contacting electrical ground conductors at the same time. The printed layer thickness was 2 mils. The copper paste layer was then cured in a convection oven at 150° C. for 30 minutes. For mechanical protection, all covered areas with conductive silicone and copper paste on the PWB were finally coated with standard solder mask using standard PWB processing.

In another embodiment: Example 2, the solvent-free liquid conductive material was prepared, as described in Example 1. An additive type circuit board was prepared and adhesion promoted, as described in Example 1. The solvent-free conductive material was applied to the circuit board and surface roughened, as described in example 1. Different from example 1, a silver based polymer thick film conductive paste was applied by screen printing on a second predetermined area of the PWB over the previously applied conductive silicone, contacting electrical ground conductors at the same time. The printed layer thickness was 2 mils. The silver paste layer was then cured in a convection oven at 150° C. for 30 minutes. For mechanical protection, a solder mask was applied over the previously coated areas, as described in example 1.

Disclosed above is a means for an additive process for manufacturing circuit boards, there is another means to manufacture circuit boards as well called a subtractive process. The differences between a subtractive process and an additive process are illustrated in C. F. Coombs; *Printed Circuits Handbook, Third Edition*; Section 2.4.1 p 2.8 and the *Electronic Engineers' Handbook* at pages 7–70.

Figure 2:
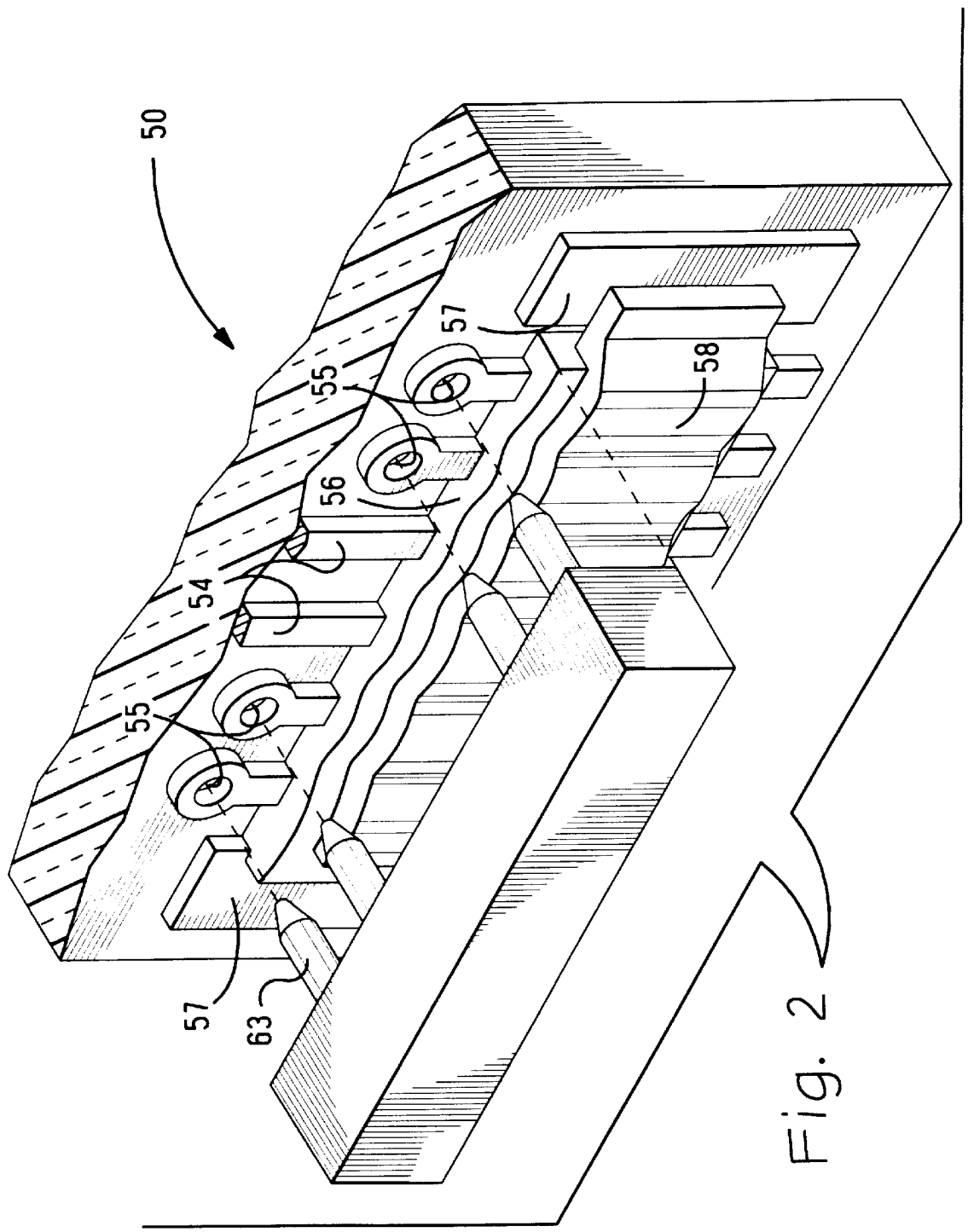
FIG. 2 is an isometric view of the present invention on a subtractive processed circuit board.

In accordance with FIG. 2, the alternative embodiment using a subtractive process to manufacture printed circuit boards having a base laminate 50 is overlayed with solder coated conductor lines 54 leading to pads and holes 55, for pin contacts 63, and at least one ground contact line 57 that are overlayed by a conductive material 56, which is overlayed by an adhesive metallic ink 58 layer. The difference between the additive process and the subtractive process of manufacturing a printed circuit board is that there is no permanent resist material in a subtractive process. Thus, when the solvent free liquid conductive material 16 overlays the base laminate 64 in the first predetermined area, the liquid conductive material is in direct contact with the exposed base laminate and the conductor lines 54. The metallic ink layer 18 is placed upon the liquid conductive material and a ground contact line in the same manner as illustrated above.

In example 3, the solvent-free liquid conductive material was prepared by mixing 56 parts by volume of GE RTV160 liquid silicone polymer with 35 parts by volume of Alcan x30 aluminum powder and with 9 parts by volume of Hydral 705 aluminum trihydrate powder. The materials were mixed together in a plastic container using a standard laboratory mixer with a multi-blade mixing head. A printed wiring board (PWB) was prepared by a subtractive process. It was adhesion promoted with a silane solution, as described in example 1. The solvent-free conductive material was then stencil printed onto a first predetermined area on the PWB yielding a 2 mils thick layer, The silicone layer was air cured at room temperature for 24 hours. The cured silicone layer was surface roughened as described in example 1. A silver paste was applied to the PWB prepared by a subtractive process in the next step, as described in example 2. For mechanical protection, solder mask was applied over the previously coated areas, as described in example 1.

The sample boards with different solvent-free liquid silicone polymers as the conductive material and different metallic ink layers were soldered into connectors and tested at AMP Signal Conditioning Division.

Figure 3:
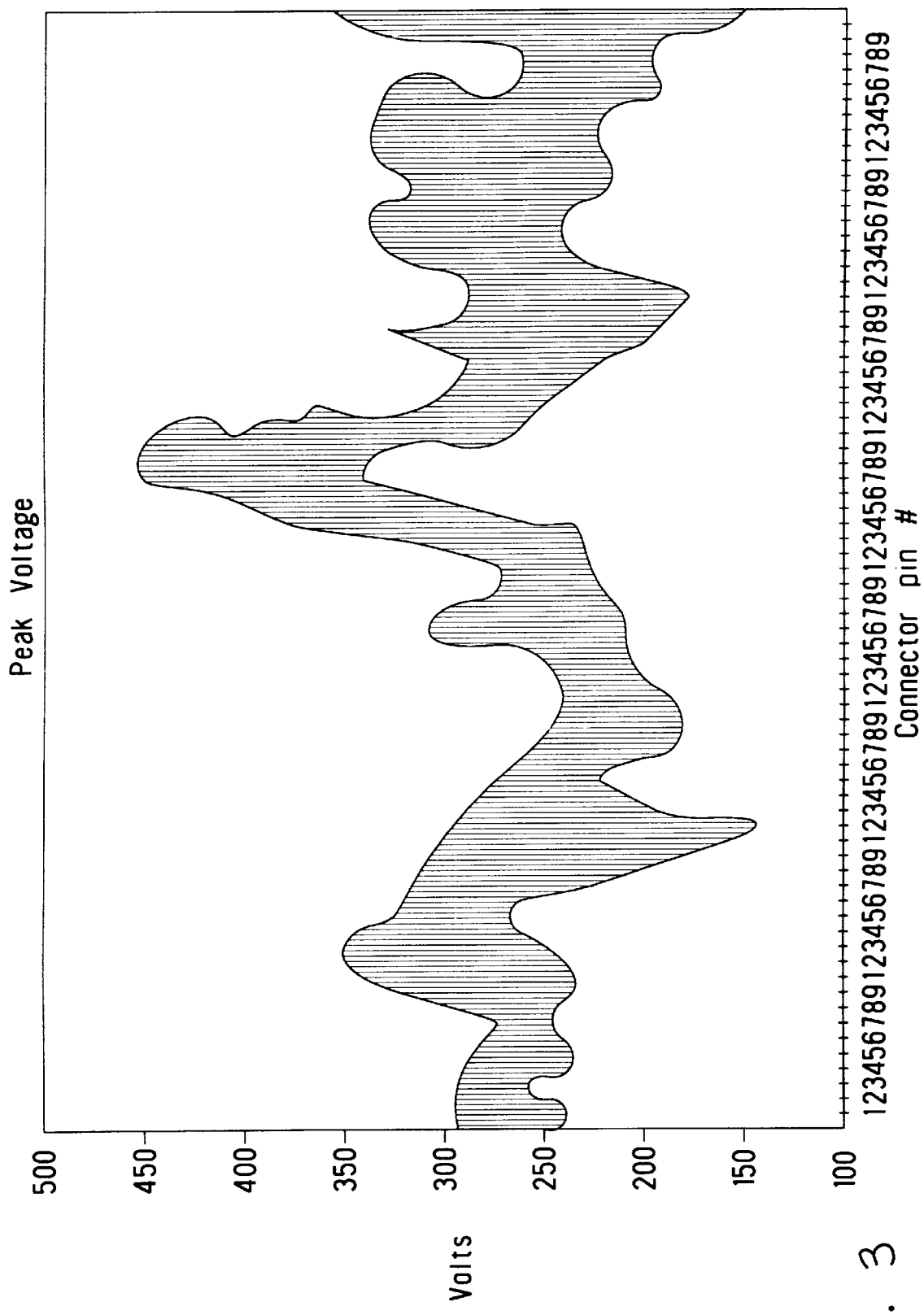
FIG. 3 is a graph of peak voltage versus connector pin numbers on a circuit board overlaid with Silicone RTV11 overlaid with copper paste.
Figure 4:
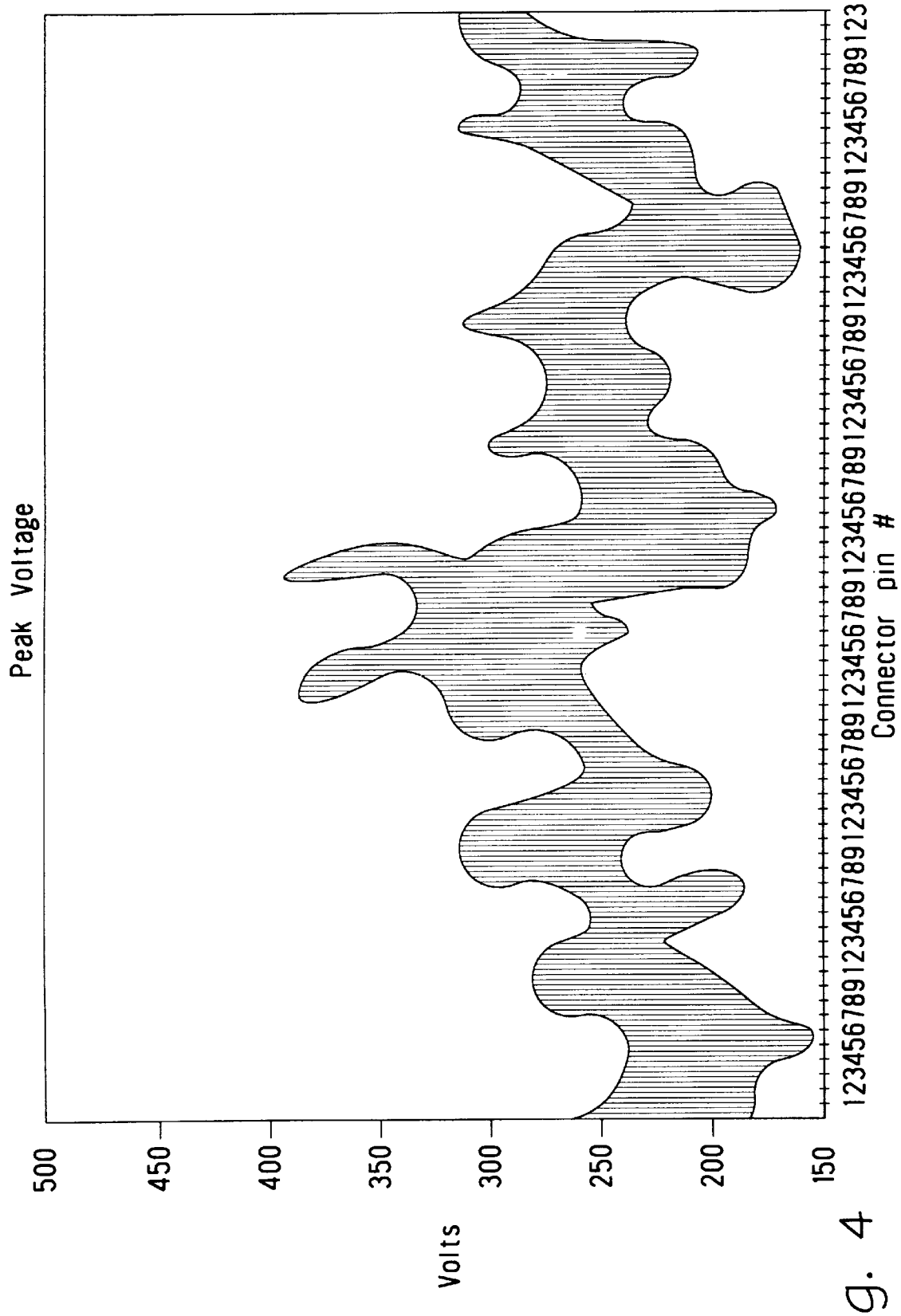
FIG. 4 is a graph of peak voltage versus connector pin numbers on a circuit board overlaid with Silicone RTV11 overlaid with DuPont silver paste.
Figure 5:
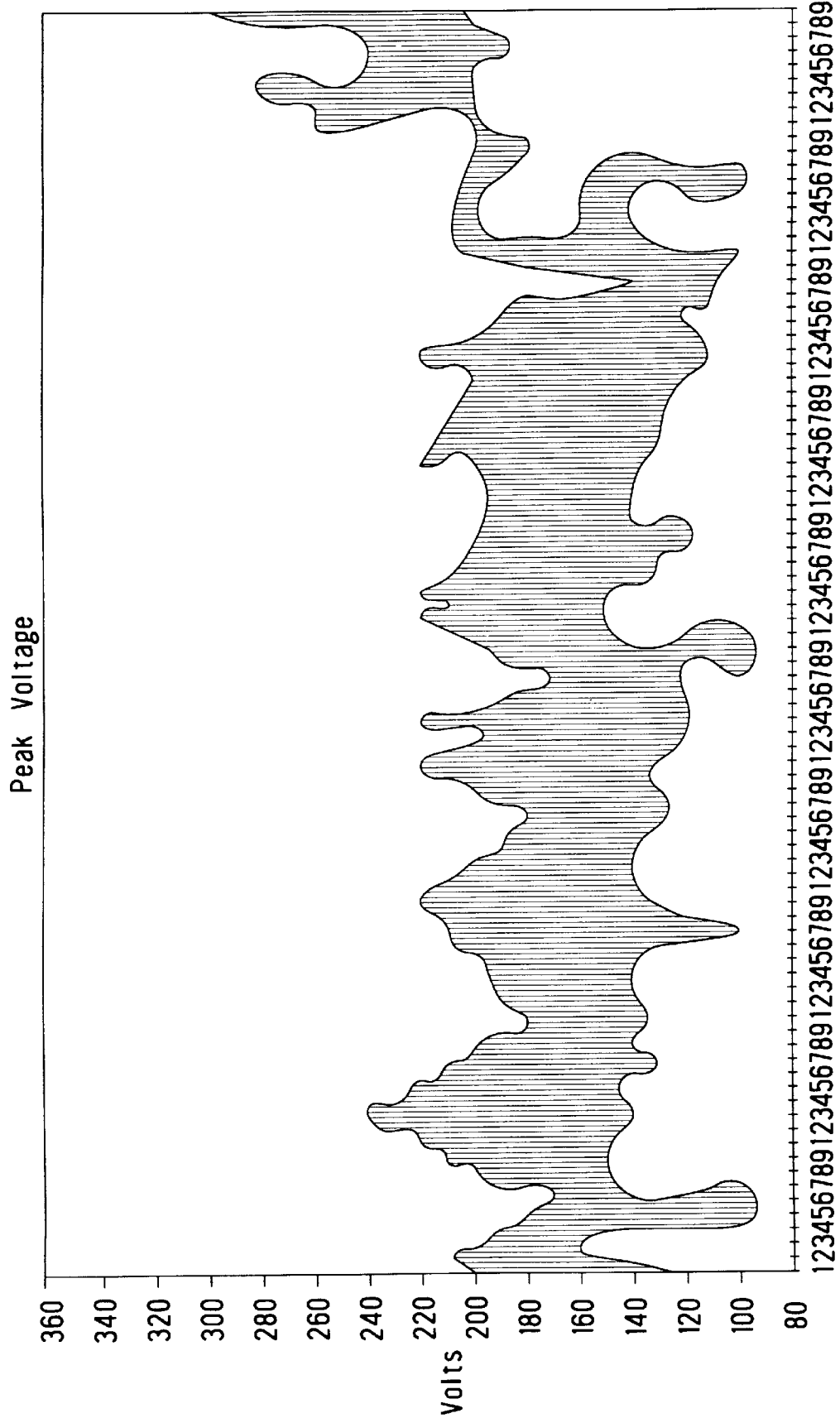
FIG. 5 is graph of volts versus connector pin numbers on a peak voltage of Silicone RTV160 and DuPont silver paste.

In the first run of samples, five pulses of 15 kilovolts were injected into each individual pin. The first sample shown in FIG. 3 shows the peak voltage and clamp voltage distribution for the invention using Example 1. FIG. 4 shows the same for Example 2. And FIG. 5 again shows the same for Example 2 except that silicone RTV160 polymer and DuPont silver paste were used. As can be seen, the peak voltages remained mostly under 350V.

Figure 6:
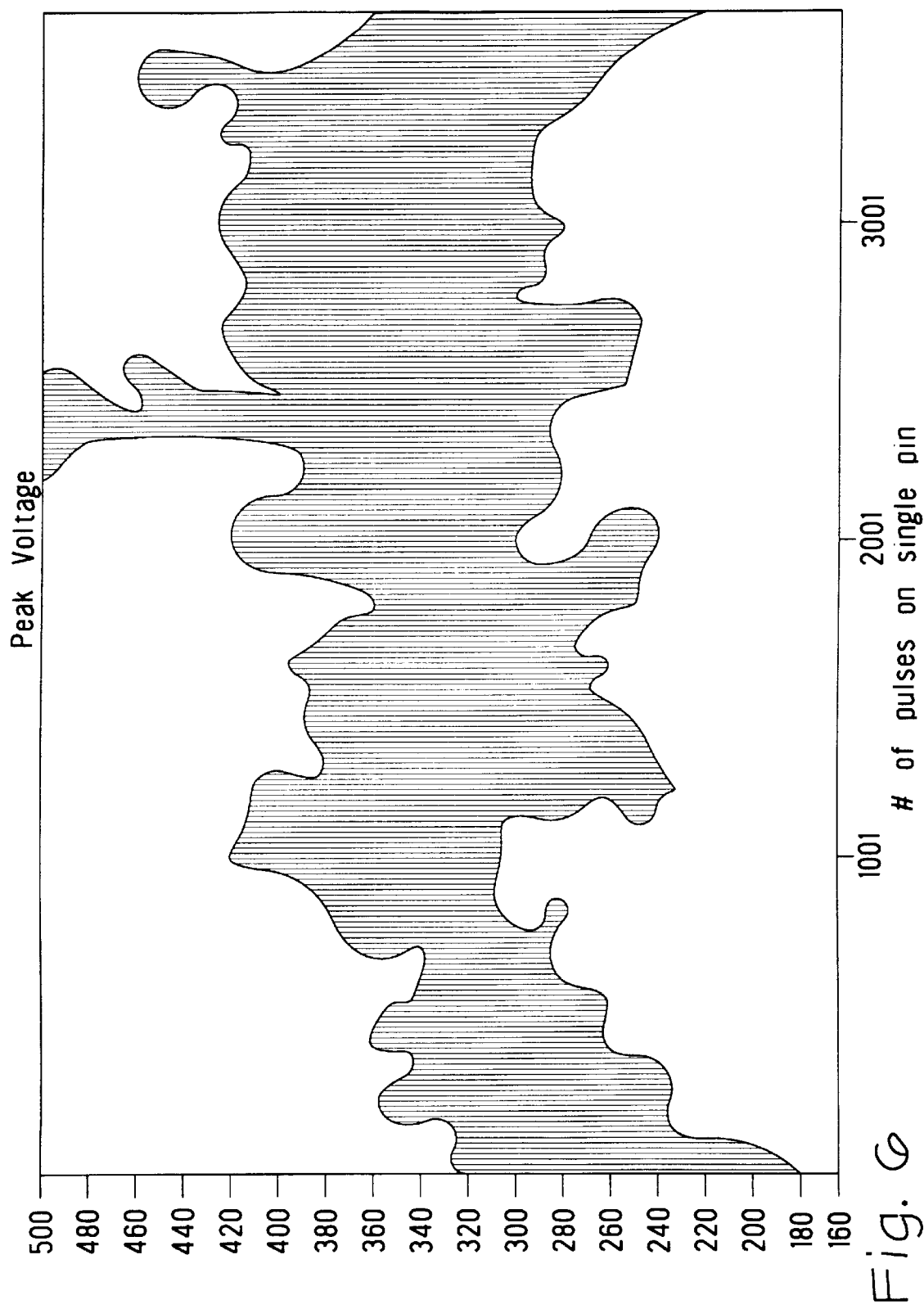
FIG. 6 is a graph of peak voltage versus number of pulses on a single pin on a circuit board overlaid with Silicone RTV11 overlaid with copper paste.
Figure 7:
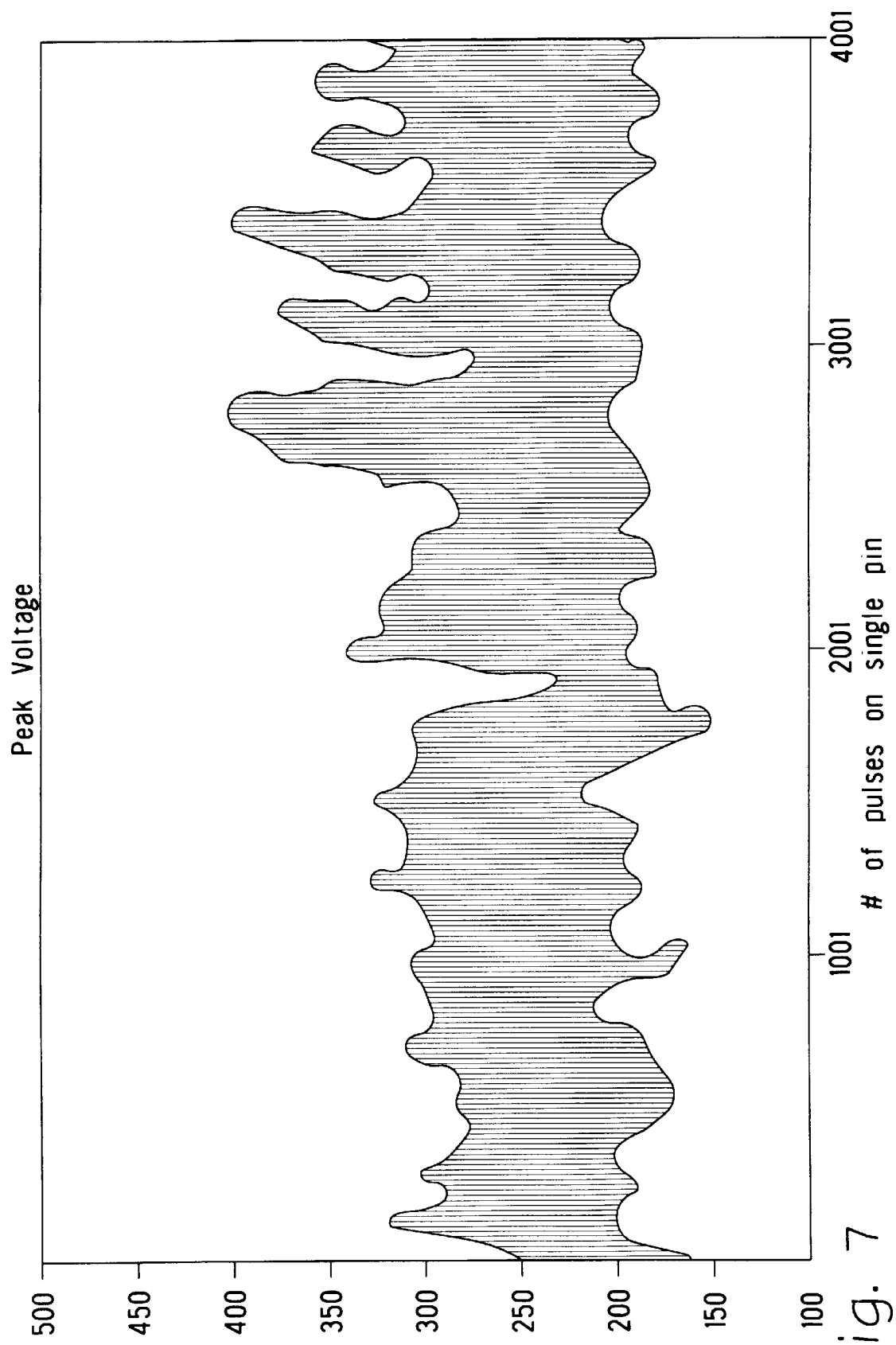
FIG. 7 is a graph of peak voltage versus number of pulses on a single pin on a circuit board overlaid with Silicone RTV160 overlaid with DuPont paste.

The second run of samples tested long term performance. More than 3000 pulses of 15 kilovolts were injected into single pins. FIG. 6 shows the results for Example 1, while FIG. 7 the results for Example 2 except that silicone RTV160 polymer and DuPont silver paste were used. The copper paste sample started out with peak voltages of about 200V and stabilized after 1000 pulses at around 350V. The silver paste sample performed clearly better, with a narrower distribution and peak voltages between 200V and 300V.

Many changes, modifications, variations, and other uses and applications of the subject invention will, however, become apparent to those skilled in the art after considering the specification and the accompanying drawings which disclose preferred embodiments thereof. All such changes, modifications, variations and other uses which do not depart from the spirit of the invention are deemed to be covered by the invention which is limited only by the claims that follow.

We claim:

1. An overvoltage protection material comprising: a silicone polymer, a metallic compound material in powdered form, and a nonconductive inorganic material in powdered form, said nonconductive inorganic material comprising aluminum trihydrate, said silicone polymer being in liquid form together with a curing agent in liquid form, and being free of an organic solvent and water, and constructed for being deposited in liquid form prior to curing.

2. An overvoltage protection material as recited in claim 1, wherein said curing agent is dibutyl tin dilaurate.

3. An overvoltage protection material as recited in claim 1, wherein said curing agent is dibutyl tin dilaurate, such that the material cures at a temperature below 93° C.

4. An overvoltage protection material as recited in claim 1, wherein said metallic compound is in the range of 25–45 parts per 100 parts by volume.

5. An overvoltage protection material as recited in claim 1, wherein said silicone polymer if at least 40 parts per 100 parts by volume.

6. An overvoltage protection material as recited in claim 4, wherein said silicone polymer if at least 40 parts per 100 parts by volume.

7. An overvoltage protection material as recited in claim 1, wherein said nonconductive inorganic material in powdered form is not more than 20 parts per 100 parts by volume.

8. An overvoltage protection material as recited in claim 5, wherein said nonconducive inorganic material in powdered form is not more that 20 parts per 100 parts by volume.

9. An overvoltage protection material as recited in claim 6, wherein said nonconductive inorganic material in powdered form is not more than 20 parts per 100 parts by volume.

* * * * *